United States Patent [19]

Kovacs et al.

[11] Patent Number: 5,414,390

[45] Date of Patent: May 9, 1995

[54] CENTER FREQUENCY CONTROLLED PHASE LOCKED LOOP SYSTEM

[75] Inventors: Janos Kovacs, North Andover; Ronald Kroesen, Harvard, both of Mass.

[73] Assignee: Analog Devices, Inc., Norwood, Mass.

[21] Appl. No.: 304,248

[22] Filed: Sep. 12, 1994

[51] Int. Cl.[6] .......................... H03L 7/07; H03L 7/10; H03L 7/18; G11B 20/10
[52] U.S. Cl. ................................ 331/2; 331/14; 331/17; 331/34; 360/51; 375/376
[58] Field of Search ............ 331/2, 8, 14, 17, 34; 360/51; 375/120

[56] References Cited

U.S. PATENT DOCUMENTS

| | | | |
|---|---|---|---|
| 4,641,048 | 2/1987 | Pollock | 327/284 X |
| 4,980,652 | 12/1990 | Tarusawa et al. | 331/14 X |
| 5,157,355 | 10/1992 | Shikakura et al. | 331/14 X |
| 5,258,877 | 11/1993 | Leake et al. | 360/51 |
| 5,302,919 | 4/1994 | Abe | 331/34 X |
| 5,329,251 | 7/1994 | Llewellyn | 360/51 |
| 5,343,167 | 8/1994 | Masumoto et al. | 331/17 X |
| 5,359,298 | 10/1994 | Abe | 331/17 X |

*Primary Examiner*—David Mis
*Attorney, Agent, or Firm*—Joseph S. Iandiorio; Kirk Teska; Iandiorio & Teska

[57] ABSTRACT

A center frequency controlled phase locked loop system includes a primary phase locked loop having a first voltage controlled oscillator including a first voltage to current converter whose output current drives a first current controlled oscillator to produce the primary clock signal to be locked onto an input signal; a second phase locked loop having a second voltage controlled oscillator including a second voltage to current converter whose output current drives a second current controlled oscillator to produce the synthesized clock signal whose frequency is approximately that of the input signal or integral multiple thereof; and a current copier circuit for copying the output current from the second voltage to current converter and delivering it to the first current controlled oscillator to maintain the center frequency of the first voltage controlled oscillator at approximately the output frequency of the synthesized clock signal.

3 Claims, 2 Drawing Sheets

CENTER FREQUENCY CONTROLLED PHASE LOCKED LOOP SYSTEM

FIELD OF INVENTION

This invention relates to a center frequency controlled phase locked loop system.

BACKGROUND OF INVENTION

Phase locked loop (PLL) circuits are widely used in disk drive read channels. In such applications the PLL must be running at no more than a 1 or 2% difference with respect to the anticipated frequency of the read signal. In order to keep the PLL in its free running mode within 1 or 2% of the anticipated frequency a second PLL operating in the frequency and phase lock mode is used as a frequency synthesizer to operate at a frequency which is within 1 or 2% of the anticipated frequency of the read signal. A MUX or other switching device is used to feed the signal from the second PLL to the input of the first, primary, PLL when no read is occurring and to feed the read signal to the input of the primary PLL when a read is taking place. While this assures that the primary PLL will lock in on the read signal when called upon, it introduces other problems: the voltage controlled oscillator (VCO) in the primary PLL must be carefully tuned to a certain frequency which will be within ±20% of the read signal frequency. This is not always practical because process deviations can normally vary the value of resistors by ±30% and of capacitors by ±20%. One way to deal with this is to laser trim or otherwise carefully trim to obtain the resonant center frequency.

Another approach is to implement the entire system using digital circuitry which is complex and costly. See U.S. Pat. No. 4,929,918. Another approach is to employ external calibration techniques and circuitry. "A 7 Mbytes (65 MHz), Mixed-Signal, Magnetic Recording Channel DSP Using Partial Response Signaling With Maximum Likelihood Detection", Philpon et at., *IEEE Journal of Solid Circuits*, Vol. 29, No. 3, March 1994. One shortcoming of all these approaches is that once the center frequency is set there is no way to easily adjust it as it drifts with temperature and voltage supply or as the required synthesizer clock frequency is changed by the user.

SUMMARY OF INVENTION

It is therefore an object of this invention to provide a center frequency controlled phase locked loop system.

It is a further object of this invention to provide such a center frequency controlled phase locked loop system whose center frequency is easily and automatically changed.

It is a further object of this invention to provide such a center frequency controlled phase locked loop system which eliminates problems associated with changes in frequency with time and voltage fluctuations.

It is a further object of this invention to provide such a center frequency controlled phase locked loop system which is simpler, more accurate and reliable.

It is a further object of this invention to provide such a center frequency controlled phase locked loop system which reduces the difference between the synthesizer clock frequency and the initial VCO frequency of the primary phase locked loop by an order of magnitude.

The invention results from the realization that an improved phase locked loop system whose primary VCO center frequency is easily, automatically, adjustable to maintain the center frequency of the primary VCO within not 20% but 2% of the synthesized clock frequency can be achieved, where the current controlled oscillators in the VCOs are virtually identical, by copying the current used to drive the current controlled oscillator in the secondary phase locked loop to control the center frequency of the current controlled oscillator in the primary voltage controlled oscillator so that the synthesized clock frequency and primary clock frequency are set within 1 to 2% of each other.

This invention features a center frequency controlled phase locked loop system. There is a primary phase locked loop having a first voltage controlled oscillator including a first voltage to current converter whose output current drives a first current controlled oscillator to produce the primary clock signal to be locked onto an input signal. A second phase locked loop has a second voltage controlled oscillator including a second voltage to current converter whose output current drives a second current controlled oscillator to produce the synthesized clock signal whose frequency is approximately that of the input signal or an integral multiple thereof. A current copier circuit copies the output current from the second voltage to current converter and delivers it to the first current controlled oscillator to maintain the center frequency of the first voltage controlled oscillator at approximately the output frequency of the synthesized clock signal.

In a preferred embodiment the current copier circuit may include a sample and hold circuit. The current copier circuit may include a control circuit such as the switching elements included in the sample and hold circuit for fixing the current supplied from the second voltage to current converter to the first current controlled oscillator when the primary phase locked loop is locking onto an input signal such as for example when a read signal is being acquired from a disk drive.

DISCLOSURE OF PREFERRED EMBODIMENT

Other objects, features and advantages will occur to those skilled in the art from the following description of a preferred embodiment and the accompanying drawings, in which.

Figure 1:
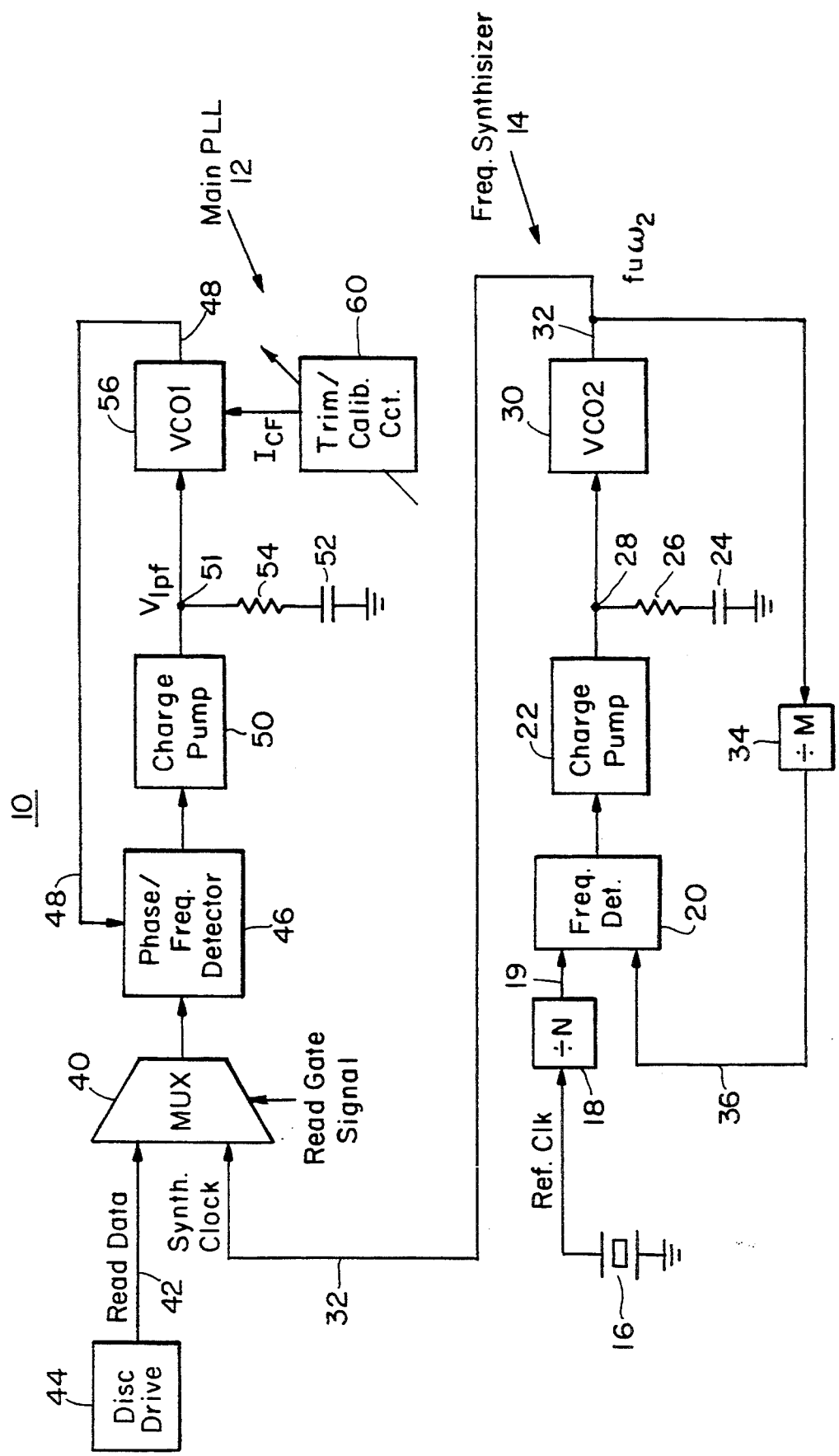
FIG. 1 is a schematic block diagram of a prior art phase locked loop system used in a disk drive read channel.

There is shown in FIG. 1 a phase locked loop system 10 including a primary phase locked loop 12 and a secondary phase locked loop or frequency synthesizer 14. Secondary loop 14 is driven from a clock source such as crystal oscillator 16 whose output is submitted to divide by N circuit 18 and then to frequency detector 20. Frequency detector 20 drives a charge pump 22 which charges capacitor 24 through resistor 26 if frequency detector 20 indicates the need to increase the frequency, or it discharges capacitor 24 if frequency detector 20 indicates the need to decrease the frequency. The voltage at point 28 thus drives voltage controlled oscillator 30 to increase or decrease its output frequency on line 32. This frequency is fed back to divide by M circuit 34 to provide the other input on line 36 to frequency detector 20. It is the difference between the input on line 36 and the input on line 19 from divide by N circuit 18 which controls the output frequency on line 32. The synthesizer clock is delivered to the switching circuit such as MUX multiplexer 40 which forms a part of the primary phase locked loop 12. The other input to MUX 40 is the read data channel 42 from disk drive 44. MUX 40 supplies to phase frequency detector 46 one of the inputs, either the synthesizer clock 32 or read data signal 42. Phase/frequency detector 46 detects any difference between the input from MUX 40 and the input on line 48 and provides an output indicative thereof to the charge pump 50, which behaves similarly to charge pump 22 in secondary loop or frequency synthesizer 14 and similarly charges capacitor 52 through resistor 54. Voltage controlled oscillator 56 increases or decreases the frequency at its output 48 in accordance therewith and feeds that back to phase/frequency detector 46. Voltage controlled oscillator 56 in primary loop 12 must have its center frequency controlled to within approximately twenty percent of the frequency of the synthesized clock signal on line 32. This is done by the center frequency control circuit 60 which may for example be a trimming circuit or a calibration circuit. One of the problems with such devices is that once set the center frequency cannot be easily changed to accommodate changes in demand or changes due to aging or voltage fluctuation. In order for primary phase locked loop 12 to properly synchronize with the read data signal on line 42. Loop 12 must be operating within 1 or 2% of the frequency of the read data signal. This is accomplished by providing that the synchronizer clock signal on line 32 to MUX 40 is within 1 or 2% of the anticipated or expected frequency of the read data signal on line 42. The synthesizer clock signal on line 32 is set to the proper value by the choice of an M and N, the divisors in divider circuits 34 and 18, respectively.

Figure 2:
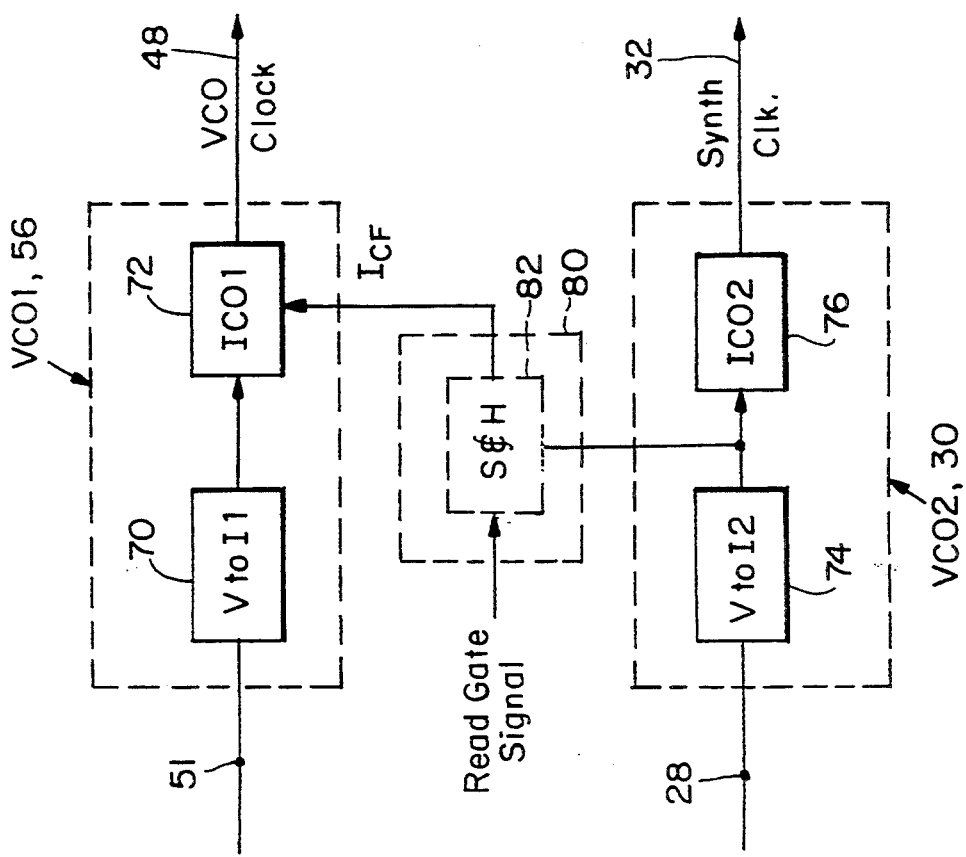
FIG. 2 is a schematic block diagram of the center frequency controlled phase locked loop system according to this invention which can be used in the phase locked loop system of FIG. 1.

In accordance with this invention the frequency of VCO can be easily, adjustably, continually kept within 20% of the synthesizer clock signal on line 32 and in fact can be kept to within 1 or 2% of that signal and so within 1 or 2% of the frequency of the read data signal on line 42. VCO1 56, FIG. 2, includes voltage to current converter 70 and current controlled oscillator 72. Voltage controlled oscillator VCO2 30 in secondary loop 14 also includes a voltage to current converter 74 and current controlled oscillator 76.

It is a realization of this invention that since the current supplied from voltage to current converter 74 to current controlled oscillator 76 is a current which provides a synthesizer clock signal on line 32 which is within 1 or 2% of the expected frequency of the read data signal on line 42 that this same current could be copied in current copier circuit 80 and delivered to control the center frequency current of current controlled oscillator 72. In this way the VCO clock output on line 48 from current controlled oscillator 72 would not only be within 1 or 2% instead of 20% of the synthesizer clock and read data signal frequencies, but it would also be controlled in real time. That is, any time the synthesizer clock signal frequency changed in order to accommodate an expected change in the read data signal frequency or in accommodating time or voltage drift, the center frequency of current controlled oscillator 72 would be changed automatically accordingly. Current copier circuit 80 may be implemented as shown by a sample and hold circuit 82.

Since sample and hold circuit 82 includes switching means, it may perform intrinsically as a control circuit for fixing the current supplied from the second voltage to current converter 74 to the first current controlled oscillator 72. That is, whenever a read gate signal occurs, sample and hold circuit 82 is made to hold the particular value stored in it at that moment and maintain that value as the input to current controlled oscillator 72 during the duration of the read operation. This is done so that during the read operation only the incoming read data signal on line 42 will control the frequency of loop 12; otherwise there would be two signals.

Figure 3:
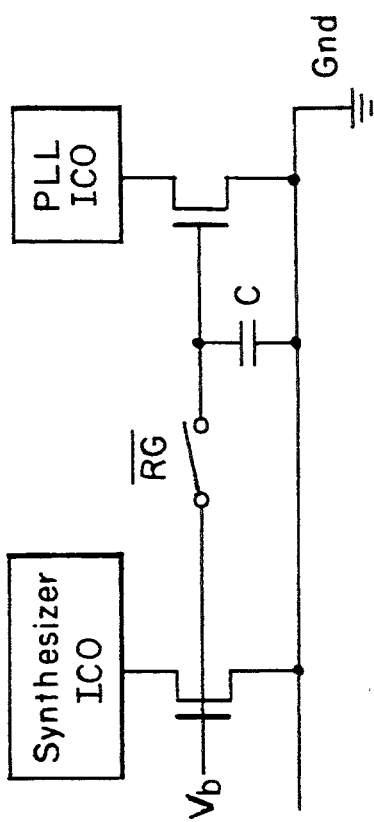
FIG. 3 is a schematic diagram of a specific implementation of the center frequency controlled phase locked loop system according to this invention.

The operation of current copier 80 utilizing sample and hold circuit 82 is shown in greater detail in FIG. 3. FET 90 in voltage to current converter VCO2 74 controls the current controlled oscillator ICO2 76. The voltage $V_b$ on the gate of FET 90 is mirrored at the gate of FET 92 in copier 80 to create an identical current, here called $I_{CF}$ to drive current to voltage converter 72. Since both current to voltage converters 76 and 72 are identical in terms of their process and fabrication, the same current applied to both will cause both circuits to provide the same output frequency within a few percent. When it is desired to read the associated disk, a read gate signal opens switch 94 in sample and hold circuit 82 so that capacitor C 96 stores the voltage then present and maintains that voltage on the gate of FET 92 during the entire read operation, so that it is only the frequency of the read signal which is affecting the frequency of the phase locked loop system.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A center frequency controlled phase locked loop (PLL) system, comprising:
   a primary PLL having a first voltage controlled oscillator including a first voltage to current converter whose output current drives a first current controlled oscillator to produce the primary clock signal to be locked on to an input signal;
   a second PLL having a second voltage controlled oscillator including a second voltage to current converter whose output circuit drives a second current controlled oscillator to produce the synthesized clock signal whose frequency is approximately that of the input signal or an integral multiple thereof; and
   a current copier circuit for copying the output current from said second voltage to current converter and delivering it to said first current controlled oscillator to maintain the center frequency of said first voltage controlled oscillator at approximately the output frequency of said synthesized clock signal.

2. The center frequency controlled phase locked loop system of claim 1 in which said current copier circuit includes a sample and hold circuit.

3. The center frequency controlled phase locked loop system of claim 1 in which said current copier circuit includes a control circuit for fixing the current supplied from said second voltage to current converter to said first current controlled oscillator when said primary PLL is locking on to an input signal.

* * * * *